United States Patent
Takemura et al.

(10) Patent No.: US 10,459,035 B2
(45) Date of Patent: Oct. 29, 2019

(54) CHARGE STATE ESTIMATION METHOD FOR LITHIUM ION BATTERY AND CHARGE STATE ESTIMATION DEVICE FOR LITHIUM ION BATTERY BY USING CORRESPONDENCE BETWEEN VOLTAGE CHARGE RATE AND THE STATE OF CHARGE OF THE LITHIUM ION BATTERY

(71) Applicant: MITSUBISHI ELECTRIC CORPORATION, Chiyoda-ku (JP)

(72) Inventors: Daigo Takemura, Chiyoda-ku (JP); Hiroto Nishiguchi, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 61 days.

(21) Appl. No.: 15/738,192

(22) PCT Filed: Jul. 12, 2016

(86) PCT No.: PCT/JP2016/070525
§ 371 (c)(1),
(2) Date: Dec. 20, 2017

(87) PCT Pub. No.: WO2017/010475
PCT Pub. Date: Jan. 19, 2017

(65) Prior Publication Data
US 2018/0203071 A1    Jul. 19, 2018

(30) Foreign Application Priority Data
Jul. 13, 2015 (JP) ................................. 2015-139717

(51) Int. Cl.
*G01R 31/367* (2019.01)
*H01M 10/42* (2006.01)
(Continued)

(52) U.S. Cl.
CPC ........ *G01R 31/367* (2019.01); *H01M 4/5825* (2013.01); *H01M 10/0525* (2013.01);
(Continued)

(58) Field of Classification Search
USPC .................................................. 324/426–435
See application file for complete search history.

(56) References Cited

U.S. PATENT DOCUMENTS 8,163,410 B2 *   4/2012   Fulop ...................... H01M 2/30
                                                                    429/61
2011/0012604 A1   1/2011   Tsujiko et al.
(Continued)

FOREIGN PATENT DOCUMENTS

DE    10 2014 206 112 A1    10/2015
JP       2009-252381 A       10/2009
(Continued)

OTHER PUBLICATIONS

International Search Report dated Oct. 4, 2016 in PCT/JP2016/070525, filed on Jul. 12, 2016.
(Continued)

*Primary Examiner* — Jay Patidar
(74) *Attorney, Agent, or Firm* — Oblon, McClelland, Maier & Neustadt, L.L.P.

(57) ABSTRACT

A method of estimating a state of charge of a lithium ion battery, which uses a lithium phosphate compound having an olivine-type crystal structure for a positive electrode and uses an active material exhibiting no potential fluctuation due to an insertion/desorption reaction of lithium for a negative electrode, based on a voltage change rate. The method includes: storing a map representing a correspondence relationship between the voltage change rate and the state of charge at a plurality of charging/discharging rates; obtaining a candidate for a present state of charge from an
(Continued)

actually measured voltage change rate, by referring to the map; and obtaining the present state of charge through a comparison between the candidate for the state of charge obtained during the charging and the candidate for the state of charge obtained during the discharging.

12 Claims, 6 Drawing Sheets

(51) Int. Cl.
  *H01M 10/48* (2006.01)
  *H02J 7/00* (2006.01)
  *H01M 4/58* (2010.01)
  *H01M 10/0525* (2010.01)
  *G01R 31/378* (2019.01)
  *G01R 31/3842* (2019.01)
  *H01M 4/02* (2006.01)

(52) U.S. Cl.
  CPC ........... *H01M 10/42* (2013.01); *H01M 10/48* (2013.01); *H02J 7/0021* (2013.01); *H02J 7/0047* (2013.01); *G01R 31/378* (2019.01); *G01R 31/3842* (2019.01); *H01M 2004/028* (2013.01); *H01M 2220/20* (2013.01); *H02J 2007/005* (2013.01); *Y02E 60/122* (2013.01)

(56) References Cited

U.S. PATENT DOCUMENTS

2013/0043876 A1* 2/2013 Liu .................... G01R 31/3842
                                                              324/426
2013/0314050 A1  11/2013  Matsubara et al.
2014/0266060 A1   9/2014  Ying
2015/0280476 A1  10/2015  Osswald

FOREIGN PATENT DOCUMENTS

| JP | 2010-190639 A | 9/2010 |
| JP | 2010-283922 A | 12/2010 |
| JP | 2013-247003 A | 12/2013 |
| JP | 2014-190723 A | 10/2014 |

OTHER PUBLICATIONS

Office Action dated Sep. 13, 2018 in German Patent Application No. 112016003166.1, 17 pages (with English translation).

* cited by examiner

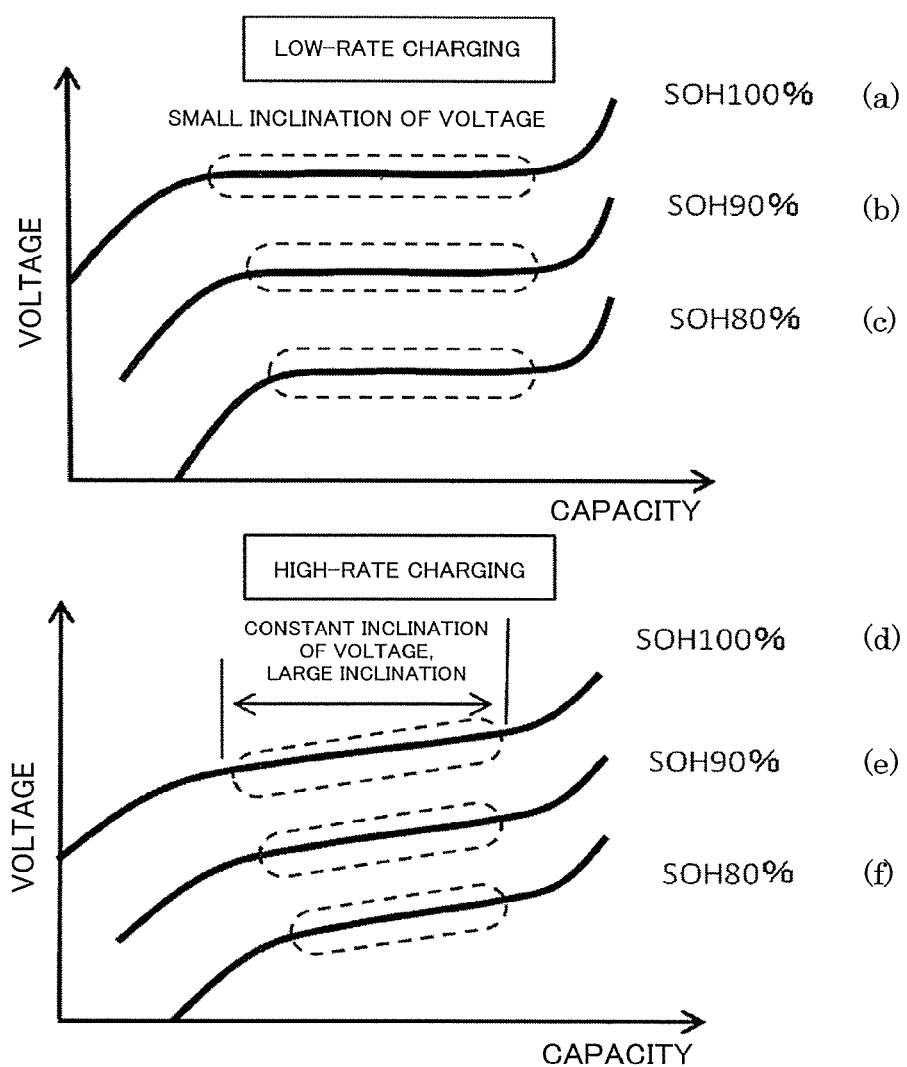

CHARGE STATE ESTIMATION METHOD FOR LITHIUM ION BATTERY AND CHARGE STATE ESTIMATION DEVICE FOR LITHIUM ION BATTERY BY USING CORRESPONDENCE BETWEEN VOLTAGE CHARGE RATE AND THE STATE OF CHARGE OF THE LITHIUM ION BATTERY

TECHNICAL FIELD

The present invention relates to a state-of-charge (state of charge; SOC) estimation method for a lithium ion battery that uses an olivine-type lithium iron phosphate as a positive electrode active material and a graphite-based carbon material as a negative electrode active material, and to a state-of-charge estimation apparatus for the lithium ion battery.

BACKGROUND ART

A lithium ion battery has been used mainly for a mobile purpose as a lightweight electricity storage device having a high energy density. In recent years, the lithium ion battery is used for a stationary power supply, an electric vehicle, a hybrid vehicle, a hybrid railway vehicle, and other such purpose that requires a large amount of energy.

A lithium phosphate compound having an olivine-type crystal structure, for example, $LiFePO_4$ or $LiMnPO_4$, is high in theoretical capacity, low in cost, and excellent in thermal stability at a time of charging, and is therefore attracting attention as a promising positive electrode active material.

However, a lithium ion battery using an olivine-type phosphate compound, for example, $LiFePO_4$ or $LiMnPO_4$, for a positive electrode has a stable voltage over a wide range, and exhibits substantially no voltage fluctuations due to a change in SOC. This raises a problem in that it is difficult to detect an SOC from the voltage.

A lithium-containing titanium oxide or a carbon material, for example, graphite-based carbon or low-crystalline graphitizable carbon (soft carbon) or non-graphitizable carbon (hard carbon) subjected to low-temperature baking, is used as a negative electrode active material. In particular, graphite-based carbon is often used as the negative electrode active material.

A lithium ion battery using low-crystalline soft carbon or hard carbon exhibits a large voltage change due to charging/discharging. However, a lithium ion battery using a graphite-based material or a lithium-containing titanium oxide exhibits a small voltage change, and hence it is difficult to detect the SOC from the voltage.

In particular, in a case of using a lithium ion battery (hereinafter referred to as "iron-phosphate-based lithium ion battery") using an olivine-type phosphate compound as a positive electrode active material and graphite-based carbon as a negative electrode active material, a battery voltage is in a constant state over a wide range, which raises a problem in that it is difficult to detect the SOC.

In general, the following methods are known as a method of estimating the SOC of a battery:
  an estimation method of creating OCV-SOC characteristics by measuring a relationship between an open circuit voltage (OCV) and an SOC of a battery to be used, and determining the SOC with reference to the OCV-SOC characteristics;
  an estimation method of integrating a discharging current starting from a full charge state; and
  an estimation method of integrating a charging current starting from full discharge.

Specific examples of estimating the SOC of the battery include the following related art (see, for example, Patent Literature 1). In Patent Literature 1, an OCV voltage is measured by shifting the SOC of the iron-phosphate-based lithium ion battery through charging or discharging to a high-SOC area exhibiting a large voltage change around full charge or an area exhibiting a large voltage change near a full discharge state at a last stage of the discharging, and the SOC is detected with reference to the OCV-SOC characteristics.

Meanwhile, Patent Literature 1 employs a method of estimating the SOC through current integration in an area corresponding to a large part of the OCV-SOC characteristics and exhibiting small voltage fluctuations.

CITATION LIST

Patent Literature

[PTL 1] JP 2010-283922 A

SUMMARY OF INVENTION

Technical Problem

However, the related art has the following problems. In Patent Literature 1, it is necessary to estimate the SOC by performing charging up to an SOC of about 100% or performing discharging down to an SOC of about 0%. Meanwhile, a battery is used only in an intermediate SOC for a hybrid vehicle or other such purpose. Therefore, the above-mentioned related art cannot be used for the hybrid vehicle or other such purpose that does not involve charging/discharging to be performed up to the area of the SOC of 100% or down to the area of the SOC of 0%.

In particular, in an iron-phosphate-based lithium ion battery, an OCV is constant in an area of an SOC of about 30% to 70%, and there remains a problem of being unable to determine the SOC through voltage measurement.

In addition, in order to measure the OCV, it is necessary to leave the battery standing at an open circuit voltage for a long period of time, and to measure the voltage under a state in which a current is not caused to flow after voltage fluctuations are stabilized.

The present invention has been made in order to solve the above-mentioned problems, and has an object to obtain a state-of-charge estimation method for a lithium ion battery and a state-of-charge estimation apparatus for the lithium ion battery, which are capable of carrying out SOC estimation for an iron-phosphate-based lithium ion battery using an olivine-type lithium iron phosphate for a positive electrode and a graphite-based active material for a negative electrode without performing charging up to an area near the SOC of 100% or discharging down to the SOC of 0%.

Solution to Problem

According to one embodiment of the present invention, there is provided a state-of-charge estimation method for a lithium ion battery, for estimating a state of charge of a lithium ion battery, which uses a lithium phosphate compound having an olivine-type crystal structure for a positive electrode and uses an active material exhibiting no potential fluctuation due to an insertion/desorption reaction of lithium for a negative electrode, based on a voltage change rate being a value obtained by dividing a voltage change per unit time during charging or during discharging by a current capacity caused to flow per unit time, the state-of-charge estimation method including: a first step of storing, in a first storage unit, a first map representing a correspondence relationship between the voltage change rate and the state of charge of the lithium ion battery at a plurality of charging rates and a second map representing a correspondence relationship between the voltage change rate and the state of charge of the lithium ion battery at a plurality of discharging rates; a second step of calculating an actually measured voltage change rate of the lithium ion battery based on a voltage value and a current value measured during the charging/discharging, obtaining a candidate for a present state of charge of the lithium ion battery from the actually measured voltage change rate by referring to the first map during the charging and referring to the second map during the discharging, and storing the candidate for the present state of charge in a second storage unit; and a third step of obtaining the present state of charge through a comparison between the candidate for the state of charge obtained during the charging and the candidate for the state of charge obtained during the discharging, which are stored in the second storage unit.

Further, according to one embodiment of the present invention, there is provided a state-of-charge estimation apparatus for a lithium ion battery, which is configured to estimate a state of charge of a lithium ion battery, which uses a lithium phosphate compound having an olivine-type crystal structure for a positive electrode and uses an active material exhibiting no potential fluctuation due to an insertion/desorption reaction of lithium for a negative electrode, based on a voltage change rate being a value obtained by dividing a voltage change per unit time during charging or during discharging by a current capacity caused to flow per unit time, the state-of-charge estimation apparatus including: a first storage unit configured to store a first map representing a correspondence relationship between the voltage change rate and the state of charge of the lithium ion battery at a plurality of charging rates and a second map representing a correspondence relationship between the voltage change rate and the state of charge of the lithium ion battery at a plurality of discharging rates; a second storage unit configured to store a candidate for a present state of charge during the charging and a candidate for the present state of charge during the discharging; a charging/discharging measurement unit configured to measure a voltage and a current of the lithium ion battery; and an estimation computing unit configured to: calculate an actually measured voltage change rate of the lithium ion battery based on a voltage value and a current value measured during the charging/discharging by the charging/discharging measurement unit; obtain the candidate for the present state of charge of the lithium ion battery from the actually measured voltage change rate by referring to the first map during the charging and referring to the second map during the discharging; store the candidate for the present state of charge in the second storage unit; and obtain the present state of charge through a comparison between the candidate for the state of charge obtained during the charging and the candidate for the state of charge obtained during the discharging, which are stored in the second storage unit.

Advantageous Effects of Invention

According to the present invention, there is provided a configuration for carrying out high-rate charging and high-rate charging/discharging for the lithium ion battery using a lithium phosphate compound having an olivine-type crystal structure as a positive electrode active material and using a graphite-based active material or other such negative electrode active material exhibiting a constant potential even when an insertion/desorption reaction of lithium occurs, to thereby increase a voltage change in an intermediate SOC during the charging or during the discharging and estimate the SOC based on the voltage change rate during the charging or the voltage change rate during the charging/discharging. As a result, it is possible to obtain the state-of-charge estimation method for a lithium ion battery and the state-of-charge estimation apparatus for the lithium ion battery, which are capable of carrying out SOC estimation for an iron-phosphate-based lithium ion battery using an olivine-type lithium iron phosphate for a positive electrode and a graphite-based active material for a negative electrode without performing charging up to an area near the SOC of 100% or discharging down to the SOC of 0%.

BRIEF DESCRIPTION OF DRAWINGS

FIG. 9 is a comparative graph between charging profiles at the time of low-rate charging and at the time of high-rate charging for the lithium ion battery in a second embodiment of the present invention.

DESCRIPTION OF EMBODIMENTS

A lithium ion battery being a subject to be estimated in SOC estimation of one embodiment of the present invention uses $LiFePO_4$, $LiMnPO_4$, or other such lithium phosphate compound having an olivine-type crystal structure as a positive electrode active substance material.

Normally, $LiFePO_4$, $LiMnPO_4$, or other such lithium phosphate compound having the olivine-type crystal structure is low in electron conductivity, and is therefore used by being coated with a material high in electron conductivity on the surface. Most coating materials are conductive carbon materials, but in the following description, coating materials including a lithium phosphate compound of the positive electrode active material coated with tin oxide, titanium oxide, ITO, or other such conductive oxide are referred to as "positive electrode active substance material".

Even when a part of $LiFePO_4$, $LiMnPO_4$, or the like is replaced by a transition metal, $LiFePO_4$, $LiMnPO_4$, or the like having the olivine-type crystal structure is included in a lithium-iron-phosphate-based positive electrode active material.

The above-mentioned active substance material is a powdered material, and hence a binder and a conductive assistant are added in order to mold an active material layer as a positive electrode. As the binder, polyvinylidene fluoride (PVDF) or a copolymer PVDF, acrylic rubber, styrene butadiene rubber (SBR), polytetrafluoroethylene (PTFE), and carboxyl methyl cellulose (CMC) may be used, for example.

In addition, as the conductive assistant, a carbon black, such as acetylene black and ketjen black, may be used in order to obtain electron conductivity of a positive electrode active material layer.

Next, a description is made of charging/discharging characteristics of a lithium iron phosphate exhibited when a coin battery is manufactured by using $LiFePO_4$ as the positive electrode active material, using metallic lithium for a negative electrode, and using as an electrolyte an electrolyte for the lithium ion battery, which is obtained by dissolving $LiPF_6$ in a mixed solvent of a cyclic carbonate and a chain carbonate, and is charged/discharged with a current density of 0.5 mA/cm$^2$.

Figure 1:
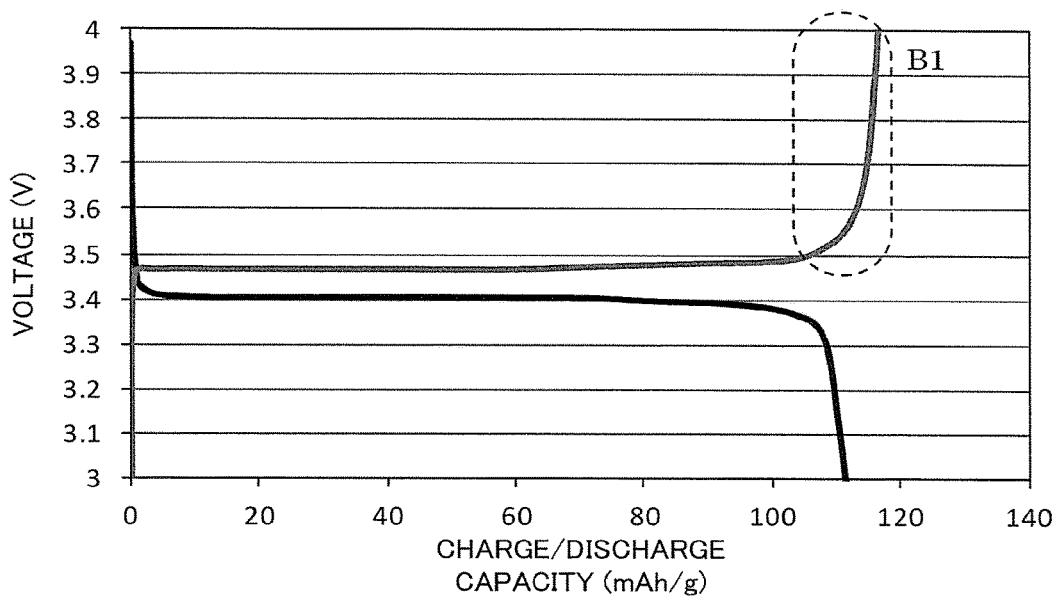
FIG. 1 is a graph for showing a charging/discharging profile of a lithium iron phosphate in a coin battery.

FIG. 1 is a graph for showing a charging/discharging profile of a lithium iron phosphate in the coin battery. At a time of discharging, the lithium iron phosphate has a plateau area around 3.4 V, and a voltage change from 20 mAh/g to 70 mAh/g is substantially 0 V. Therefore, an area in which the voltage change is observed is only an area immediately after the charging and an area at a last stage of the charging.

When the battery is manufactured in combination with graphite of the negative electrode, an irreversible capacity is larger in the negative electrode than in the positive electrode. Therefore, the voltage change immediately after the charging becomes unable to be observed, and only the area at the last stage of the charging in the positive electrode, which is indicated by B1 in FIG. 1, can be confirmed when the battery is manufactured.

In the lithium ion battery being the subject to be estimated in the SOC estimation of one embodiment of the present invention, a graphitized carbon material, for example, natural graphite or artificial graphite, is used as a negative electrode active substance material. A graphite-based carbon material has a feature of exhibiting a small voltage change at a time of charging/discharging and having a flat area (voltage flat portion or plateau area).

Such an active substance material is a powdered material, and hence a binder is added in order to mold an active material layer as the negative electrode. As the binder, polyvinylidene fluoride (PVDF) or a copolymer PVDF, acrylic rubber, styrene butadiene rubber (SBR), polytetrafluoroethylene (PTFE), and carboxyl methyl cellulose (CMC) may be used, for example.

Further, in the improvement of the conductivity, in the same manner as in the positive electrode, a carbon black, such as acetylene black or ketjen black, is used as the conductive assistant in some cases.

At a time of charging, in regard to natural graphite or a further graphitized carbon material, when a lithium ion is inserted (intercalated) between graphene layers, an intercalation compound having the lithium ion between the graphene layers is formed.

Next, a description is made of charging/discharging characteristics of graphitized carbon (artificial graphite) exhibited when a coin battery is manufactured by using graphitized artificial graphite for the positive electrode and metallic lithium for the negative electrode and using as the electrolyte an electrolyte for the lithium ion battery, which is obtained by dissolving $LiPF_6$ in the mixed solvent of the cyclic carbonate and the chain carbonate, and is charged/discharged with the current density of 0.5 mA/cm$^2$.

Figure 2:
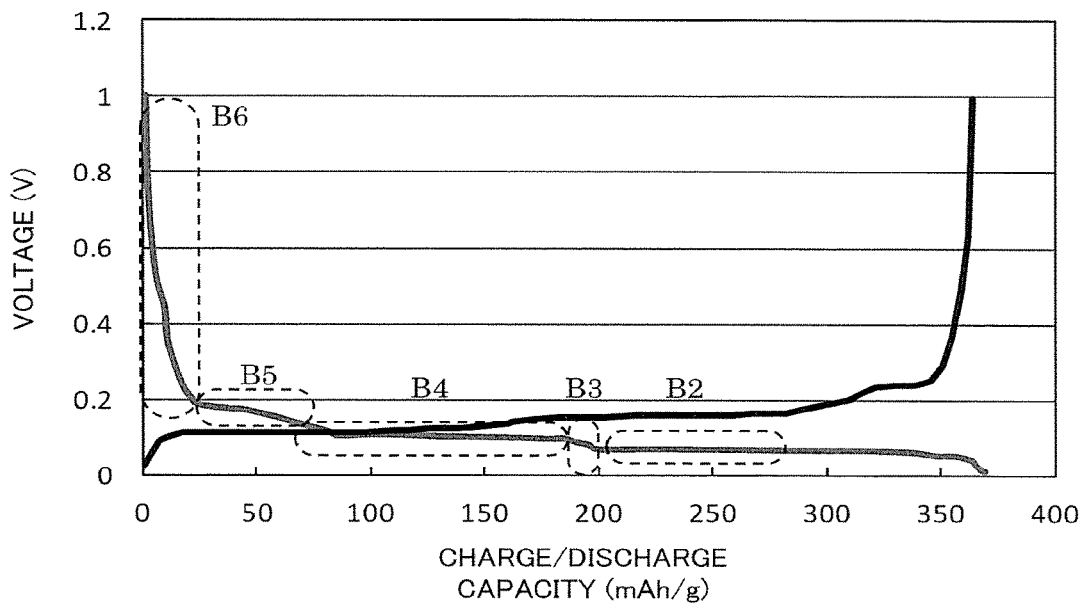
FIG. 2 is a graph for showing a charging/discharging profile of graphitized carbon (artificial graphite) in the coin battery.

FIG. 2 is a graph for showing a charging/discharging profile of the graphitized carbon (artificial graphite) in the coin battery. The negative electrode active material having a developed graphite structure has a flat area exhibiting an extremely small voltage change, which is called "stage structure", when the lithium ion is inserted or desorbed between graphite layers due to the charging/discharging. Therefore, at a potential of 0.25 V or smaller, a charging/discharging curve has a plurality of stages and a plurality of flat areas.

As the characteristic parts, there are a voltage flat part B2, a voltage flat part B4, and a part B3 exhibiting a relatively large voltage change. In addition, the charging/discharging curve includes a part B5 exhibiting a large voltage change but having a plateau area as well and a part B6 exhibiting a large voltage change at an early stage of the charging.

The flat area part B2 is an area called "first stage", in which the lithium ion is inserted into or desorbed from each layer between the graphite layers. The flat area part B4 is an area called "second stage", in which the lithium ion is inserted into or desorbed from every other layer between the graphite layers. In addition, the part B3 is a part in which the first stage and the second stage are switched, and is an area exhibiting a large voltage change.

When the constant current charging is performed at a low rate, it is difficult to determine an SOC from the voltage or the voltage change in the area of B2 or B4. However, the SOC can be estimated from the part B6 exhibiting a large voltage change or the areas B3 and B5 exhibiting a large voltage change.

Meanwhile, there is a case in which the stage structure cannot be clearly confirmed due to a low degree of graphitization even when a graphite-based carbon material is used or depending on the material, and hence the charging/discharging curve does not have a plurality of plateau areas. Therefore, in such a case, there may appear one flat area at a potential of 0.25 V or lower, and it is difficult to estimate the SOC based on low-rate charging.

Therefore, in view of those problems, a state-of-charge estimation method for a lithium ion battery and a state-of-charge estimation apparatus for the lithium ion battery according to preferred embodiments of the present invention are described below with reference to the accompanying drawings.

First Embodiment

A first embodiment of the present invention is described by taking as a specific example a case in which charging/discharging is carried out for a cylindrical-shaped iron-phosphate-based lithium ion battery using $LiFePO_4$ coated with carbon on the surface as the positive electrode active material, using the graphitized artificial graphite as the negative electrode active material, and using as the electrolyte the electrolyte for the lithium ion battery, which is obtained by dissolving LiPF$_6$ in the mixed solvent of the cyclic carbonate and the chain carbonate.

Under a state under which the lithium ion battery is not lowered in capacity, a discharge capacity obtained when the discharging is performed from an SOC of 100% to an SOC of 0% at 1 C is set to 2.5 Ah, and a rated capacity is set to 2.5 Ah. A voltage range to be used is set to from 2.0 V to 3.6 V.

In this case, the current value of 1 C represents such a current value as to bring the discharging to an end in one hour after the lithium ion battery having a capacity of a rated capacity value is charged to the SOC of 100% and starts being subjected to the constant current discharging. In this case, a discharging current value of 1 C or a charging current value of 1 C is 2.5 A, and a current value of 0.05 C is 0.125 A. The charging performed at a current of 5 A is equivalent to the charging performed at 2 C.

In the first embodiment, the SOC of 0% represents a state under which the discharging has been performed down to a usage lower-limit voltage at the current value that enables all of a current capacity of the lithium ion battery to be released. For example, a state of performing the discharging down to a usage lower-limit voltage value of 2.0 V of the lithium ion battery at the current value of 1 C and then performing the discharging with a constant voltage of 2.0 V until a discharging current reaches a current value of equal to or smaller than 1% of the time of constant current discharging is set as the SOC of 0%.

Meanwhile, the SOC of 100% represents a state under which the charging has been performed up to a usage upper-limit voltage value. For example, a state of performing the charging up to 3.6 V being the usage upper-limit voltage value of the lithium ion battery at the current value of 1 C and then performing the charging with a constant voltage of 3.6 V until a current value of equal to or smaller than 1% of the time of constant current charging is reached is set as the SOC of 100%.

In addition, a state of health (SOH) is an index indicating a deterioration state, and is defined by the discharge capacity of the lithium ion battery. An SOH of 100% is a state under which the discharge capacity has not decreased from an initial discharge capacity or the rated capacity value. In this case, specifically, the capacity discharged from the SOC of 100% down to the SOC of 0% exhibits a state of being 2.5 Ah from the beginning.

Meanwhile, an SOH of 90% represents a state under which the capacity discharged from the SOC of 100% down to the SOC of 0% has the discharge capacity reduced by 10% from the state of the SOH of 100%. Specifically, the SOH of 90% is the state under which the discharge capacity is 2.25 Ah.

Figure 3:
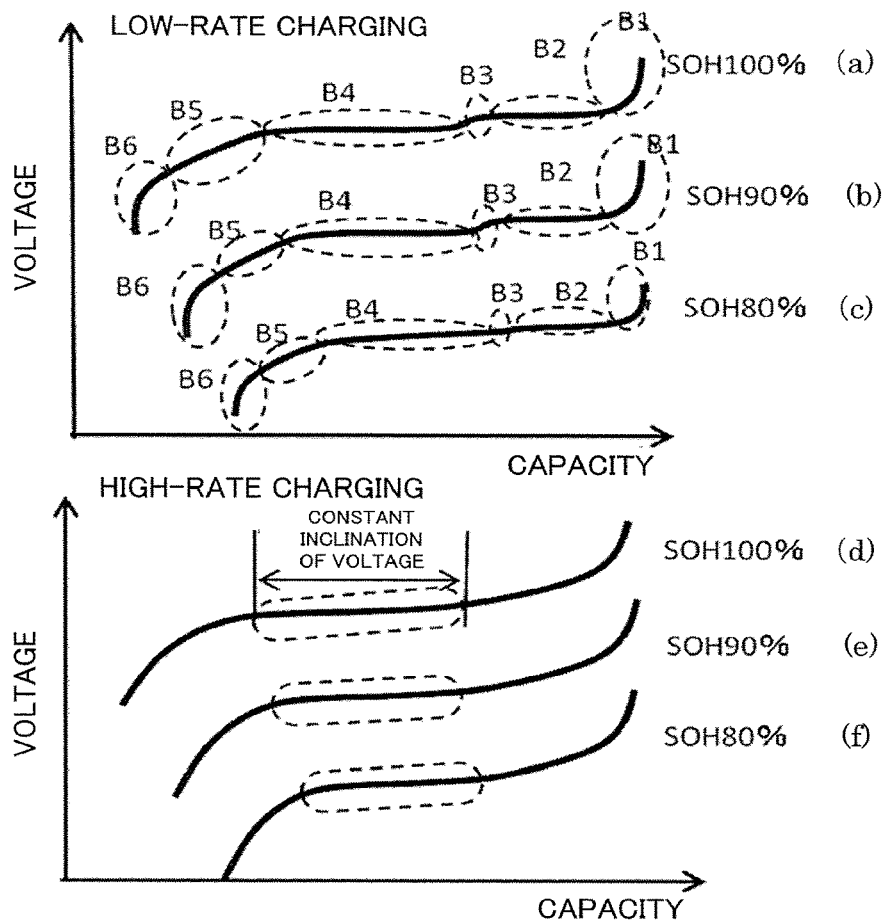
FIG. 3 is a comparative graph between charging profiles at a time of low-rate charging and at a time of high-rate charging for a lithium ion battery using a lithium iron phosphate for a positive electrode and using artificial graphite having a plurality of plateau areas for a negative electrode in a first embodiment of the present invention.

FIG. 3 is a comparative graph between charging profiles at a time of low-rate charging and at a time of high-rate charging for a lithium ion battery using a lithium iron phosphate for a positive electrode and using artificial graphite having a plurality of plateau areas for a negative electrode in the first embodiment of the present invention.

Concept graphs of charge curves exhibited when the above-mentioned battery is charged at the low rate of 0.05 C are shown in parts (a) to (c) of FIG. 3. The charge curves in parts (a) to (c) of FIG. 3 are shown by combining the charge curve for LiFePO$_4$ of FIG. 1 and the charge curve for the artificial graphite of FIG. 2. In parts (a) to (c) of FIG. 3, the low-rate charging at 0.05 C is carried out, and hence a part B1 in which the voltage rises is observed at the last stage of the charging of LiFePO$_4$ shown in FIG. 1.

Further, in parts (a) to (c) of FIG. 3, there appear a flat area B2 and a flat area B4 exhibiting small voltage fluctuations of the artificial graphite, an area B3 exhibiting large voltage fluctuations, a part B5 in which the changes in the stage structure and the plateau area of the artificial graphite are combined with each other, and a part B6 in which the artificial graphite is charged to exhibit quick fluctuations of the voltage.

In measurement of the discharge capacity of the lithium ion battery, the discharge capacity is often measured at the current rate of 1 C. Therefore, in the first embodiment, when a capacity measurement current rate recommended by a battery maker is 1 C, a current rate equal to or lower than 0.5 C being ½ of the current value of 1 C is assumed to be referred to as "low rate". Meanwhile, a current rate equal to or higher than 2 C being equal to or larger than twice as large as the current value of 1 C is assumed to be referred to as "high rate". However, when there is a change of a capacity measurement value recommended by the battery maker, the definitions of the low rate and the high rate may be changed.

Parts (a) to (c) of FIG. 3 are charge curve concepts obtained when the iron-phosphate-based lithium ion battery using LiFePO$_4$ as the positive electrode active material and using the graphitized artificial graphite as the negative electrode active material is charged at the low rate of 0.05 C. As an SOC estimation method performed at a time of low-rate charging, the SOC is estimated by detecting the part B3 exhibiting a large voltage change between the first stage B2 and the second stage B4.

Part (a) of FIG. 3 is the charge curve concept for showing the SOH of 100% under which the battery has not deteriorated at the time of low-rate charging. Part (b) of FIG. 3 is the charge curve concept for showing the SOH of 90%, and part (c) of FIG. 3 is the charge curve concept for showing an SOH of 80%. As can be understood from parts (a) to (c) of FIG. 3, the charge curves of from the SOH of 100% to the SOH of 80% exhibit no large variations, and all form the charge curve concepts exhibiting a large voltage change at an SOC of about 70% irrespective of the change in SOH.

However, as the SOH decreases from 100%, the voltage change in the area B3 becomes smaller, and the voltage change becomes much smaller with an SOH of 70%, which makes it difficult to estimate the SOC estimation. Therefore, it is preferred to estimate the SOC within a range of from the SOH of 100% to the SOH of 80%.

Further, with only this method, it is necessary to perform the charging/discharging across the part B3 exhibiting a large voltage change in the SOC of about 70%. This necessitates combination with another SOC estimation method. In a case of this sample, a position of the part B3 exhibiting a large voltage change corresponds to the SOC of about 70%. However, the position of the part B3 exhibiting a large voltage change varies depending on an active material usage ratio between the positive electrode and the negative electrode, to thereby appear on a higher-SOC side as the ratio of the negative electrode becomes larger and appear on a lower-SOC side as the ratio of the negative electrode becomes smaller.

Meanwhile, parts (d) to (f) of FIG. 3 are charge curve concepts obtained when the iron-phosphate-based lithium ion battery using LiFePO$_4$ as the positive electrode active material and using the graphitized artificial graphite as the negative electrode active material is charged at a high rate of 3 C. In this case, high-rate charging represents a charging rate equal to or higher than 2 C.

In the charge curve obtained at a time of high-rate charging, the voltage flat portion B2, the voltage flat portion B4, and the part B3 exhibiting a large voltage change in a switching part, which are observed at the time of low-rate charging, disappear to disable distinction among B2, B3, and B4. Meanwhile, at the time of high-rate charging, an inclination of the voltage relative to a charge capacity becomes larger, which facilitates the measurement of the voltage change. In view of the foregoing, a method of estimating the SOC from a voltage change rate is described below by taking a specific example.

Figure 4:
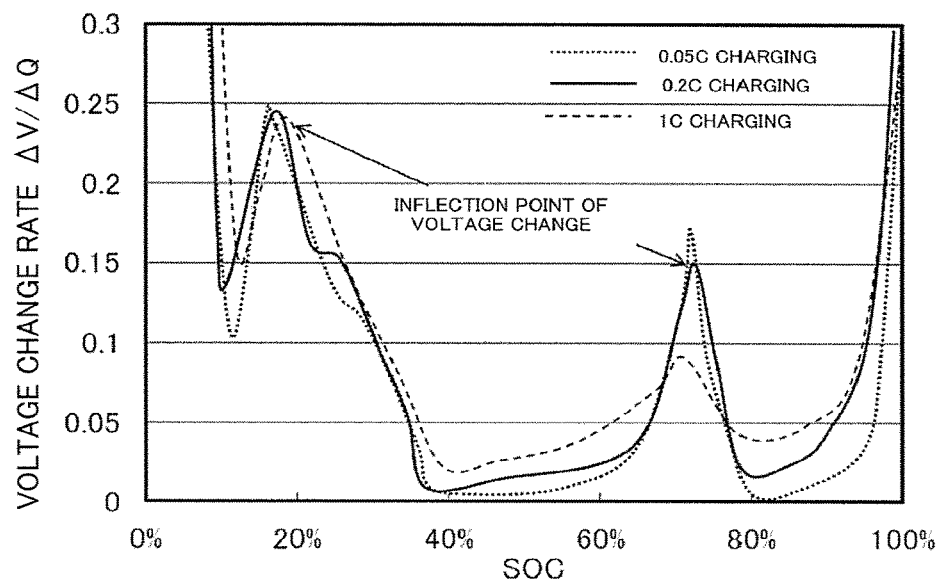
FIG. 4 is a graph for showing a relationship between a voltage change rate and an SOC exhibited when the lithium ion battery is subjected to low-rate constant current charging in the first embodiment of the present invention.

FIG. 4 is a graph for showing a relationship between the voltage change rate and the SOC exhibited when the lithium ion battery is subjected to low-rate constant current charging in the first embodiment of the present invention. Specifically, FIG. 4 is a graph for showing the relationship between the voltage change rate and the SOC exhibited when the iron-phosphate-based lithium ion battery using $LiFePO_4$ as the positive electrode active material and using the graphitized artificial graphite as the negative electrode active material is subjected to the constant current charging, and three kinds of graphs for the low-rate charging at 0.05 C and 0.2 C and for the time of charging at 1 C are shown in comparison with one another.

In this case, the voltage change rate being the vertical axis of FIG. 4 represents a value obtained by dividing a voltage change $\Delta V$ per unit time by a unit charge capacity $\Delta Q$ charged during that period, and is expressed as $\Delta V/\Delta Q$. For example, when the voltage exhibited during the charging at a constant current of 0.5 A is 3.320 V and the voltage exhibited after the charging at 0.1 Ah is 3.325 V, the voltage change at the time of charging is 0.0005 V, the unit charge capacity $\Delta Q$ is 0.1 Ah, and the voltage change rate is 0.05.

In FIG. 4, the relationship between $\Delta V/\Delta Q$ and the SOC obtained when the charging is performed at three kinds of charging rates of 0.05 C, 0.2 C, and 1 C is shown.

In the low-rate charging at 0.05 C and 0.2 C, $\Delta V/\Delta Q$ is large when the SOC is smaller than 35% or when the SOC is larger than 70%. Meanwhile, within a range of from an SOC of 40% to an SOC of 65%, the voltage change rate is low, and at the low rate, it is difficult to estimate the SOC from the voltage change rate due to a wide error range.

For example, when the voltage change rate $\Delta V/\Delta Q$ for the charging at 0.05 C is 0.01, the voltage change exhibited when the charging is performed at 0.1 Ah is 1 mV. A charge time period for this case is 2,880 seconds, and the voltage change rate per given time period is extremely low, which makes it difficult to estimate the SOC due to a measurement error.

Meanwhile, during low-rate constant current charging and during charging at 1 C, the voltage change rate exhibits an inflection point around an SOC of 18% or an SOC of 72%, and during the low-rate charging, the SOC at the inflection point is substantially constant irrespective of the charging rate.

In addition, at such an inflection point, the voltage change rate is large, which facilitates the detection. Therefore, at 1 C or lower, it is possible to estimate the SOC with high precision by detecting the inflection point of the voltage change rate during the charging instead of measuring the OCV.

Figure 5:
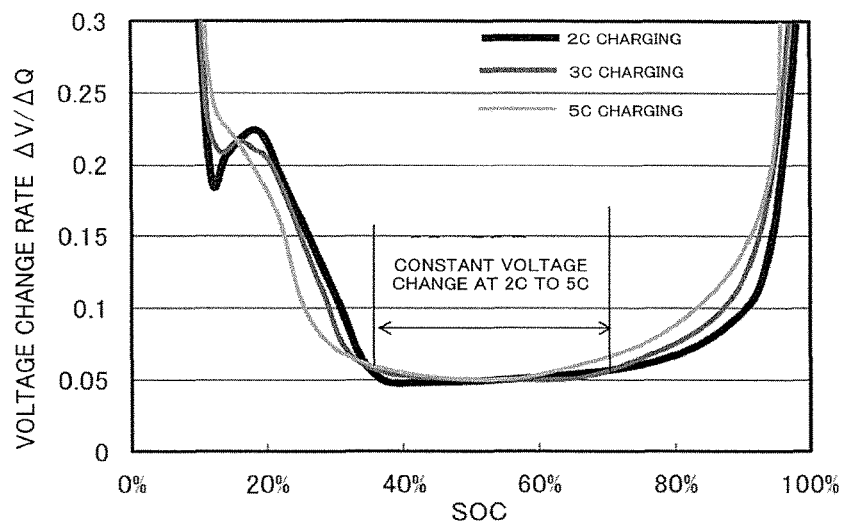
FIG. 5 is a graph for showing a relationship between the voltage change rate and the SOC exhibited when the lithium ion battery is subjected to high-rate constant current charging in the first embodiment of the present invention.

Meanwhile, FIG. 5 is a graph for showing a relationship between the voltage change rate and the SOC exhibited when the lithium ion battery is subjected to high-rate constant current charging in the first embodiment of the present invention. Specifically, FIG. 5 is a graph for showing the relationship between the voltage change rate $\Delta V/\Delta Q$ and the SOC exhibited when the same iron-phosphate-based lithium ion battery as that used in FIG. 4 is subjected to the high-rate constant current charging, and the relationships between the voltage change rates and the SOC obtained when the charging is performed at three kinds of high rates of 2 C, 3 C, and 5 C are shown in comparison with one another.

In the high-rate charging, the voltage change rate becomes higher than in the low-rate charging, and the voltage change rate has a substantially constant value within the range of from the SOC of 40% to the SOC of 65%. For example, when the voltage change rate $\Delta V/\Delta Q$ for the charging at 5 C is 0.05, the voltage change exhibited when 0.1 Ah is charged is 5 mV. The charge time period for this case is 28.8 seconds, and it is easy to grasp the change rate per given time period.

The charging rate varies from 2 C to 5 C, but the voltage change rate is substantially constant. For example, even when the charging rate varies within the range of from 2 C to 5 C, an area in which $\Delta V/\Delta Q$ does not change can be determined to exist within the range of from the SOC of 40% to 65%.

Figure 6:
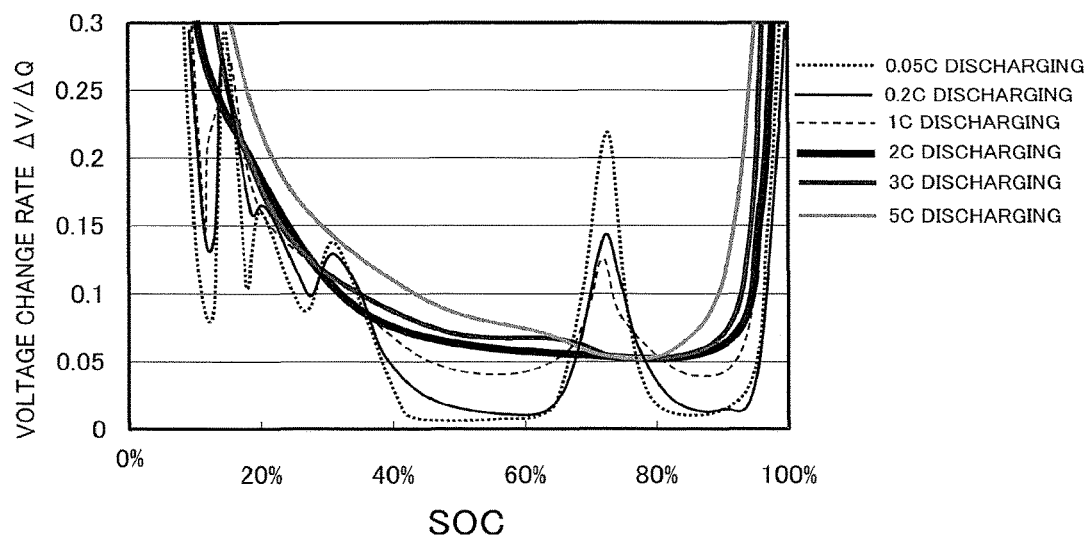
FIG. 6 is a graph for showing a relationship between the voltage change rate and the SOC exhibited when the lithium ion battery is subjected to the constant current discharging in the first embodiment of the present invention.

In contrast to FIG. 4 and FIG. 5 for showing the time of charging, FIG. 6 is a graph for showing a relationship between the voltage change rate and the SOC obtained when the lithium ion battery in the first embodiment of the present invention is subjected to the constant current discharging. Specifically, FIG. 6 is a graph for showing the relationships between the voltage change rates $\Delta V/\Delta Q$ and the SOC exhibited when the same iron-phosphate-based lithium ion battery as that used in FIG. 4 is discharged at the constant current from 0.05 C being the low rate to 5 C being the high rate in comparison with one another.

When a time of low-rate discharging is compared with a time of high-rate discharging, at the time of low-rate discharging at 0.05 C and 0.2 C, the voltage change rate $\Delta V/\Delta Q$ is low, and the voltage change rate per given time period is small as well, which makes the measurement difficult.

Meanwhile, at the time of high-rate discharging, the voltage change rate $\Delta V/\Delta Q$ becomes larger than at the time of low-rate discharging, and the measuring time becomes shorter as well, which reduces the measurement error. In addition, within the range of from the SOC of 40% to the SOC of 65%, the voltage change rate $\Delta V/\Delta Q$ has a substantially constant value (see FIG. 5) at the time of high-rate charging, while at the time of high-rate discharging, the relationship between the voltage change rate $\Delta V/\Delta Q$ and the SOC differs depending on the rate (see FIG. 6).

Therefore, the SOC can be estimated through a comparison between the relationship between the voltage change rate $\Delta V/\Delta Q$ and the SOC exhibited at the time of high-rate charging and the relationship between the voltage change rate $\Delta V/\Delta Q$ and the SOC exhibited at the time of high-rate discharging. For example, when the voltage change rate $\Delta V/\Delta Q$ is 0.05 during the charging at 5 C and the voltage change rate $\Delta V/\Delta Q$ is 0.09 during the discharging at 5 C, the SOC can be estimated to be 50%.

Figure 7:
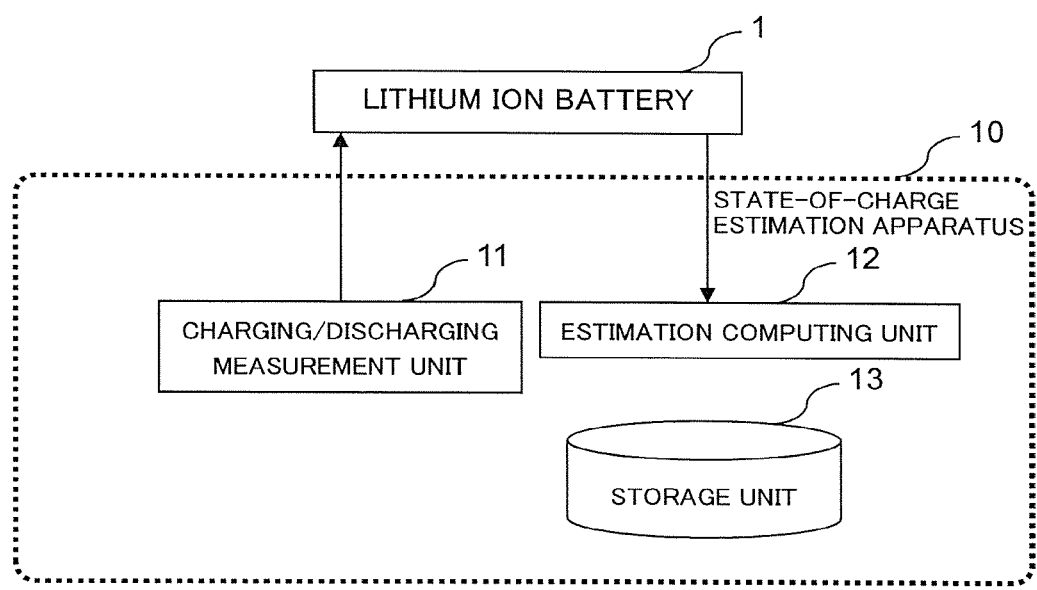
FIG. 7 is a configuration diagram of a state-of-charge estimation apparatus for a lithium ion battery according to the first embodiment of the present invention.

FIG. 7 is a configuration diagram of the state-of-charge estimation apparatus for the lithium ion battery according to the first embodiment of the present invention. A state-of-charge estimation apparatus 10 for the lithium ion battery according to the first embodiment includes a charging/discharging measurement unit 11, an estimation computing unit 12, and a storage unit 13.

The charging/discharging measurement unit 11 is a measurement unit configured to measure a voltage, a current, a charge capacity, a discharge amount, a temperature, and the like of the lithium ion battery at a time of estimating the state of charge, and may be a controller having a function of operating charging/discharging. The estimation computing unit 12 is an arithmetic unit configured to estimate the SOC by collecting data required for estimating the SOC and calculating the voltage change rate being a performance index.

The storage unit 13 is a memory including: a first storage unit configured to store in advance a voltage change rate-SOC map (first map) obtained by mapping a correspondence relationship between the voltage change rate and the state of charge at different kinds of charging rates and the voltage change rate-SOC map (second map) obtained by mapping a correspondence relationship between the voltage change rate and the state of charge at different kinds of discharging rates; and a second storage unit configured to store candidates for the state of charge during each of the charging and the discharging.

The charging/discharging measurement unit 11 has a part configured to measure a voltage of the lithium ion battery and a current flowing through the battery, and may be configured to measure temperature information as well.

The estimation computing unit 12 may be dedicated hardware, or may be a CPU configured to execute the program stored in the memory. The CPU stands for "central processing unit", and is also referred to as "central processor", "processing unit", "arithmetic unit", "microprocessor", "microcomputer", "processor", or "DSP".

The storage unit 13 corresponds to, for example, a non-volatile or volatile semiconductor memory including a RAM, a ROM, a flash memory, an EPROM, or an EEPROM, a magnetic disk, a flexible disk, an optical disc, a compact disc, MiniDisc, or a DVD.

The estimation computing unit 12 is configured to calculate the voltage change rate during the charging of a lithium ion battery 1 or the voltage change rate during the discharging of the lithium ion battery 1 based on a voltage value measured during the charging/discharging by the charging/discharging measurement unit 11. The estimation computing unit 12 is further configured to refer to the first map or the second map stored in the storage unit 13 to estimate a present state of charge of the lithium ion battery 1 from the voltage change rate calculated during the charging or during the discharging.

Figure 8:
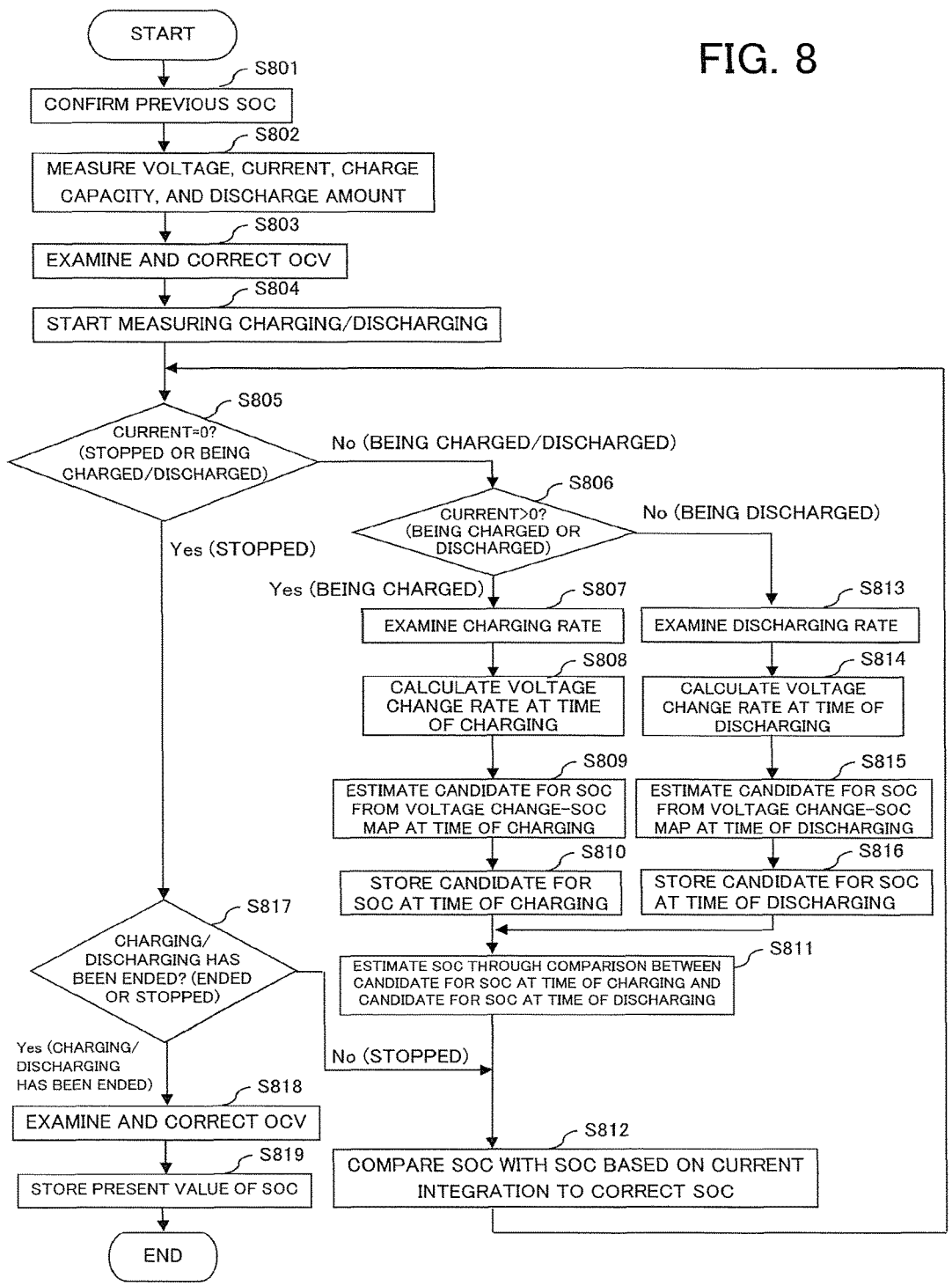
FIG. 8 is a flowchart relating to a series of processing for SOC estimation to be executed by the state-of-charge estimation apparatus for the lithium ion battery according to the first embodiment of the present invention.

FIG. 8 is a flowchart relating to a series of processing for the SOC estimation to be executed by the state-of-charge estimation apparatus for the lithium ion battery according to the first embodiment of the present invention. After the start of an estimation operation, in Step S801, the estimation computing unit 12 confirms a previous value of the SOC, which was estimated at the previous time and stored in the storage unit 13, to thereby determine the SOC before the start of the estimation operation.

Subsequently, in Step S802, the charging/discharging measurement unit 11 starts measuring the voltage, the current, the charge capacity, the discharge amount, the temperature, and the like regarding the lithium ion battery 1 being the subject to be estimated in order to estimate the SOC serving as a present value.

Then, in Step S803, the charging/discharging measurement unit 11 sets the lithium ion battery 1 to a stopped state without performing a charging/discharging operation, and at this time, the estimation computing unit 12 examines the OCV of the lithium ion battery 1 in a state of not flowing a current. The estimation computing unit 12 further estimates the present value of the SOC corresponding to the present OCV from an OCV-SOC map stored in the storage unit 13 in advance.

The estimation computing unit 12 further compares the previous value of the SOC determined in Step S801 with the estimated present value of the SOC, and corrects the SOC when there is no match with any one of the ranges B1 to B6 shown in parts (a) to (c) of FIG. 3.

Subsequently, in Step S804, the charging/discharging measurement unit 11 starts the charging/discharging. When a charging/discharging control function is provided in the outside, the charging/discharging measurement unit 11 further examines in Step S805 whether the lithium ion battery 1 is being charged/discharged or is in the stopped state. Specifically, when the current is nearly equal to zero, the charging/discharging measurement unit 11 advances to Step S817, and determines whether or not the lithium ion battery is in the stopped state or the charging/discharging has been ended.

As an example of the determination, the charging/discharging measurement unit 11 performs the determination in Step S817 based on a definition in terms of time, on/off of a switch, or the like. When the determination results in the stopped state, the procedure advances to Step S812, and when the determination results in the end of the charging/discharging, the procedure advances to Step S818.

When the procedure advances to Step S818, the estimation computing unit 12 examines the OCV of the lithium ion battery 1 in the state of not flowing a current. The estimation computing unit 12 further estimates an SOC range corresponding to the examined OCV from the OCV-SOC map stored in the storage unit 13 in advance.

The estimation computing unit 12 further selects the present SOC when the finally-estimated present SOC falls within the estimated SOC range during the charging/discharging. Meanwhile, when the present SOC deviates from the estimated SOC range, the estimation computing unit 12 selects the SOC within the SOC range corresponding to the examined OCV.

Then, in Step S819, the estimation computing unit 12 stores the SOC selected above in Step S818 in the storage unit 13 as the present value, and brings the series of processing to an end.

Meanwhile, when it is determined above in Step S805 that the lithium ion battery 1 is being charged/discharged and a current is flowing, the procedure advances to Step S806, and the estimation computing unit 12 determines whether or not the lithium ion battery 1 is being charged or discharged based on a direction of the current. When the lithium ion battery 1 is being charged, the procedure advances to Step S807, and when the lithium ion battery 1 is being discharged, the procedure advances to Step S813.

When it is determined that the lithium ion battery 1 is being charged and the procedure advances to Step S807, the estimation computing unit 12 examines the charging rate. After the charging rate is examined, in Step S808, the estimation computing unit 12 calculates the voltage change rate at the time of charging in association with the examined charging rate.

In Step S809, the estimation computing unit 12 further refers to the voltage change rate-SOC map at the time of charging stored in advance in the storage unit 13 to extract a candidate for the SOC corresponding to the voltage change rate obtained in Step S808, to thereby estimate a candidate for the SOC exhibited during the charging. After that, the procedure advances to Step S810, and the estimation computing unit 12 stores the candidate for the SOC at the time of charging in the storage unit 13.

In Step S811, when there is a candidate for the SOC at the time of discharging, which was stored at the previous time in Step S816 described later, the estimation computing unit 12 estimates the SOC through a comparison between the candidate for the SOC at the time of discharging and the candidate for the SOC at the time of charging, which was stored in Step S810. When the candidate for the SOC at the time of discharging is not stored, the procedure advances to Step S812 without the estimation performed in Step S811.

In this case, each of the numbers of candidates for the state of charge calculated during the charging and candidates for the state of charge calculated during the discharging is not necessarily one, and a plurality of candidates may exist. Therefore, in Step S811, the estimation computing unit 12 obtains the present state of charge from the closest candidates for the state of charge between one or more candidates for the state of charge calculated during the charging and one or more candidates for the state of charge calculated during the discharging.

Specifically, the estimation computing unit 12 identifies a pair of the closest values between one or more candidates for the state of charge calculated during the charging and one or more candidates for the state of charge calculated during the discharging. In addition, the estimation computing unit 12 sets an intermediate value of the identified pair as the candidate for the state of charge, and obtains the present state of charge from the intermediate value.

In the estimation processing of Step S809, in the case of the charging at the rate of 1 C or lower, the estimation computing unit 12 examines whether or not the voltage change rate calculated in Step S808 is an inflection point, and when the estimation computing unit 12 confirms that the voltage change rate is an inflection point, extracts the SOC corresponding to the voltage change rate at the inflection point. In this manner, it is expected that highly precise SOC estimation can be achieved.

When the procedure advances to Step S812 during the charging, the estimation computing unit 12 compares the SOC estimated during the charging in Step S811 with the SOC based on current integration obtained by integrating the current during the charging. When a difference between the SOC estimated during the charging and the SOC based on the current integration falls within an allowable range set in advance, the estimation computing unit 12 sets the SOC estimated during the charging as the present SOC, and when the difference falls out of the allowable range, sets the SOC based on the current integration as the present SOC. Then, the procedure returns to Step S805.

When the procedure advances to Step S812 without the estimation performed in Step S811, the estimation computing unit 12 determines that the difference falls out of the allowable range, and sets the SOC based on the current integration as the present SOC. Then, the procedure returns to Step S805.

Meanwhile, when it is determined that the lithium ion battery 1 is being discharged and the procedure advances to Step S813, the estimation computing unit 12 examines the discharging rate. After the discharging rate is examined, in Step S814, the estimation computing unit 12 calculates the voltage change rate at the time of discharging in association with the examined discharging rate.

In Step S815, the estimation computing unit 12 further refers to the voltage change rate-SOC map at the time of discharging stored in advance in the storage unit 13 to extract the candidate for the SOC corresponding to the voltage change rate obtained in Step S814, to thereby estimate the candidate for the SOC exhibited during the discharging. After that, the procedure advances to Step S816, and the estimation computing unit 12 stores the candidate for the SOC at the time of discharging in the storage unit 13.

In Step S811, when there is a candidate for the SOC at the time of charging, which was stored at the previous time in Step S810, the estimation computing unit 12 estimates the SOC through a comparison between the candidate for the SOC at the time of charging and the candidate for the SOC at the time of discharging, which was stored in Step S816. When the candidate for the SOC at the time of charging is not stored, the procedure advances to Step S812 without the estimation performed in Step S811.

In the estimation processing of Step S815, in the case of the discharging at the rate of 1 C or lower, the estimation computing unit 12 examines whether or not the voltage change rate calculated in Step S814 is an inflection point, and when the estimation computing unit 12 confirms that the voltage change rate is an inflection point, extracts the SOC corresponding to the voltage change rate at the inflection point. In this manner, it is expected that highly precise SOC estimation can be achieved.

When the procedure advances to Step S812 during the discharging, the estimation computing unit 12 compares the SOC estimated during the discharging in Step S811 with the SOC based on the current integration obtained by integrating the current during the discharging. When a difference between the SOC estimated during the discharging and the SOC based on the current integration falls within an allowable range set in advance, the estimation computing unit 12 sets the SOC estimated during the discharging as the present SOC, and when the difference falls out of the allowable range, the estimation computing unit 12 sets the SOC based on the current integration as the present SOC. Then, the procedure returns to Step S805.

When the procedure advances to Step S812 without the estimation performed in Step S811, the estimation computing unit 12 determines that the difference falls out of the allowable range, and sets the SOC based on the current integration as the present SOC. Then, the procedure returns to Step S805.

In the flowchart of FIG. 8, the case in which the constant current charging/discharging is started in Step S804 is described. However, the voltage change rate is constant within the range of from the SOC of 40% to the SOC of 65% at the time of the charging at the high rate of from 2 C to 5 C, as shown above in FIG. 5. Therefore, in a case where the current rate at the start of the calculation and the current rate at the end of the calculation are the same, the SOC can be estimated even when the current rate at the midpoint varies within the range of from 2 C to 5 C.

It is also possible to detect positions of the SOC of 18% and the SOC of 72% being the inflection points even when the charging current value or the discharging current value varies within the range of from 0.05 C to 1 C.

As described above, according to the first embodiment, the SOC can be estimated based on the voltage change rate-SOC map even when the lithium ion battery 1 is being charged or discharged. Therefore, even when there is a change in SOC, the SOC can be estimated even in an area exhibiting no change in OCV.

In addition, when attention is focused on a difference between the voltage change rate-SOC maps exhibited when the current rate is changed and a difference between the voltage change rate-SOC maps for the charging and the discharging, it is possible to estimate the SOC from the voltage change rate during the charging or during the discharging without measuring the OCV.

Second Embodiment

In a second embodiment of the present invention, a description is made of SOC estimation performed when the lithium ion battery is manufactured by using LiFePO$_4$ coated with carbon on the surface as the positive electrode active material and soft carbon, which does not clearly have a plurality of plateau areas in the negative electrode, as the negative electrode active material.

FIG. 9 is a comparative graph between charging profiles at the time of low-rate charging and at the time of high-rate charging for the lithium ion battery in the second embodiment of the present invention.

Charge curves exhibited when the charging is performed at the low rate of 0.05 C are shown in parts (a) to (c) of FIG. 9. The lithium ion battery of the second embodiment exhibits characteristics having no multistage plateau area from the SOH of 100% immediately after the manufacturing as shown in part (a) of FIG. 9. In this case, when the SOC is determined from the change rate for the low-rate charging, the voltage change is extremely small, and it is difficult to estimate the SOC from the voltage.

Part (b) of FIG. 9 is a waveform obtained by performing the charging at 0.05 C when the capacity has been reduced to 90% of an initial capacity and the SOH has decreased to 90%. The plateau area has become narrower due to the deterioration, but has the same shape as that of the SOH of 100% with the voltage change rate being extremely small, which makes it difficult to estimate the SOC from the voltage.

Part (c) of FIG. 9 relates to a case in which the SOH has decreased to 80%, and the plateau area has become much narrower, but has the same shape as that of the SOH of each of 100% and 90% with the voltage change rate being extremely small, which makes it difficult to estimate the SOC from the voltage.

Meanwhile, charge curves obtained when the charging is performed at the high rate of 3 C are shown in parts (d) to (0 of FIG. 9. In part (d) of FIG. 9 relating to a case in which the SOH is 100%, the high-rate charging is performed, and hence a voltage-capacity curve being flat in the low-rate charging has an inclination.

Therefore, such a voltage change rate $\Delta V/\Delta Q$ as described in the first embodiment, which is the value obtained by dividing the voltage change $\Delta V$ exhibited during the charging by the charge capacity $\Delta Q$ charged during that period, becomes larger in a case of the high-rate charging of the lithium ion battery of the second embodiment. Therefore, it becomes easier to determine the SOC from the voltage change rate for the high-rate charging.

When the SOH has decreased to 90% as in part (e) of FIG. 9 and when the SOH has decreased to 80% as in part (f) of FIG. 9, it becomes easier to determine the SOC in the same manner.

The voltage change rate-SOC maps for the high-rate charging and the high-rate discharging of the lithium ion battery of the second embodiment are different from each other, and the SOC can be estimated by the same method as that of the first embodiment described above. However, in the second embodiment, an inflection point is hardly observed in the voltage change rate at the time of the low-rate charging or the low-rate discharging. Therefore, it is difficult to detect such an inflection point as described above in the first embodiment.

Even in a case of using lithium titanate or other such negative electrode active material, it may be possible to use the same SOC estimation method using the voltage change rate at the time of charging/discharging.

The technical features of the first and second embodiments of the present invention described above are summarized as follows.

One of the features resides in that the SOC of the lithium ion battery, which uses the lithium phosphate compound having the olivine-type crystal structure exhibiting a small voltage change at the time of charging/discharging for the positive electrode and a graphite-based active material or other such active material exhibiting a constant potential even when an insertion/desorption reaction of lithium occurs for the negative electrode, is estimated by using, as an index value, the voltage change rate being the value obtained by dividing the voltage change by per unit time exhibited during the charging or the discharging by a current capacity caused to flow during the unit time.

Specifically, the voltage change rate-SOC map at the time of charging at different kinds of charging rates and the voltage change rate-SOC map at the time of discharging at different kinds of discharging rates are stored in advance. As a result, the SOC can be estimated through use of not an open circuit voltage but the voltage change rate during the charging or the voltage change rate during the discharging.

Another feature resides in that the high-rate charging and high-rate charging/discharging are carried out, to thereby increase the voltage change during the charging or during the discharging in an intermediate SOC, and the SOC can be estimated through a comparison between the voltage change rate during the charging and the voltage change rate during the discharging.

As a result, it is possible to estimate the SOC based on the voltage change rate of the charging/discharging in the intermediate SOC without shifting the SOC to an area near the SOC of 0% or an area near the SOC of 100%.

Still another feature resides in that, in regard to the lithium ion battery having the inflection point of the voltage change rate in a specific SOC during the charging/discharging at the charging rate or the discharging rate of 1 C or lower, it is possible to estimate the SOC by detecting the inflection point of the voltage change rate.

As a result, when the inflection point of the voltage change rate can be detected even at the charging rate or the discharging rate of 1 C or lower, the SOC of the lithium ion battery exhibiting a small voltage change at the time of charging/discharging can also be measured with high precision.

The invention claimed is:

1. A state-of-charge estimation method for a lithium ion battery, for estimating a state of charge of a lithium ion battery, which uses a lithium phosphate compound having a LiFePO$_4$ or LiMnPO$_4$ crystal structure for a positive electrode and uses an active material exhibiting no potential fluctuation due to an insertion/desorption reaction of lithium for a negative electrode, based on a voltage change rate being a value obtained by dividing a voltage change per unit time during charging or during discharging by a capacity caused to flow per unit time, the state-of-charge estimation method comprising:
a first step of storing, in a first storage, a first map representing a correspondence between the voltage change rate and the state of charge of the lithium ion battery at a plurality of charging rates and a second map representing a correspondence between the voltage change rate and the state of charge of the lithium ion battery at a plurality of discharging rates;
a second step of calculating an actually measured voltage change rate of the lithium ion battery based on a voltage value and a current value measured during the charging and discharging, obtaining a value for a present state of charge of the lithium ion battery from the actually measured voltage change rate by referring to the first map during the charging and referring to the second map during the discharging, and storing the value for the present state of charge in a second storage; and a third step of obtaining the present state of charge through a comparison between the value for the state of charge obtained during the charging and the value for the state of charge obtained during the discharging, which are stored in the second storage.

2. The state-of-charge estimation method for the lithium ion battery according to claim 1, wherein the second step comprises:

selecting, during the charging, from the first map, the correspondence at a charging rate being referred to based on the actually measured voltage change rate calculated as a present charging rate; and selecting, during the discharging, from the second map, the correspondence at a discharging rate being referred to based on the actually measured voltage change rate calculated as a present discharging rate.

3. The state-of-charge estimation method for the lithium ion battery according to claim 1, wherein the third step comprises obtaining the present state of charge from a pair of closest values for the state of charge between one or more values for the state of charge obtained during the charging and one or more values for the state of charge obtained during the discharging.

4. The state-of-charge estimation method for the lithium ion battery according to claim 1, wherein, a current value as to bring the discharging to an end in one hour after the lithium ion battery having a capacity of a rated capacity value is charged to a state of charge of 100% and starts being subjected to constant current discharging is defined as "current value of 1 C" and the charging performed at a current of 1 C is defined as "charging at 1 C":

the second step comprises storing a range of the state of charge obtained at a time of charging at a rate of 2 C or higher in the second storage, and storing values for the state of charge obtained at a time of discharging at the rate of 2 C or higher in the second storage; and the third step comprises obtaining, as the present state of charge, a value for the state of charge included in the range of the state of charge at the time of charging among the values for the state of charge at the time of discharging at the rate of 2 C or higher.

5. The state-of-charge estimation method for the lithium ion battery according to claim 1, wherein, a current value as to bring the discharging to an end in one hour after the lithium ion battery having a capacity of a rated capacity value is charged to a state of charge of 100% and starts being subjected to constant current discharging is defined as "current value of 1 C" and the charging performed at a current of 1 C is defined as "charging at 1 C", the third step comprises obtaining the present state of charge from the voltage change rate corresponding to an inflection point when the first map and the second map stored in the first storage in the first step each have the inflection point of the voltage change rate at a time of charging and discharging at a rate of 1 C or lower and the voltage change rate corresponding to the inflection point has been successfully extracted from a plurality of voltage change rates during the charging calculated at the time of charging at the rate of 1 C or lower or a plurality of voltage change rates during the discharging calculated at the time of discharging at the rate of 1 C or lower.

6. The state-of-charge estimation for the lithium ion battery according to claim 1, wherein the third step comprises comparing the present state of charge obtained from the voltage change rate and the present state of charge obtained through integrating the current during the charging and discharging, to thereby correct the present state of charge.

7. A state-of-charge estimation apparatus for a lithium ion battery; which is configured to estimate a state of charge of a lithium ion battery, which uses a lithium phosphate compound having a LiFePO$_4$ or LiMnPO$_4$ crystal structure for a positive electrode and uses an active material exhibiting no potential fluctuation due to an insertion/desorption reaction of lithium for a negative electrode, based on a voltage change rate being a value obtained by dividing a voltage change per unit time during charging or during discharging by a capacity caused to flow per unit time, the state-of-charge estimation apparatus comprising:

a first storage configured to store a first map representing a correspondence between the voltage change rate and the state of charge of the lithium ion battery at a plurality of charging rates and a second map representing a correspondence between the voltage change rate and the state of charge of the lithium ion battery at a plurality of discharging rates;

a second storage configured to store a value for a present state of charge during the charging and a value for the present state of charge during the discharging;

a charging and discharging measurement controller configured to measure a voltage and a current of the lithium ion battery; and an estimation computing circuitry configured to:

calculate an actually measured voltage change rate of the lithium ion battery based on a voltage value and a current value measured during the charging and discharging by the charging and discharging measurement controller;

obtain the value for the present state of charge of the lithium ion battery from the actually measured voltage change rate by referring to the first map during the charging and referring to the second map during the discharging;

store the value for the present state of charge in the second storage; and obtain the present state of charge through a comparison between the value for the state of charge obtained during the charging and the value for the state of charge obtained during the discharging, which are stored in the second storage.

8. The state-of-charge estimation apparatus for the lithium ion battery according to claim 7, wherein the estimation computing circuitry is configured to:

select, during the charging, from the first map, the correspondence at a charging rate being referred to based on the actually measured voltage change rate calculated as a present charging rate; and select, during the discharging, from the second map, the correspondence at a discharging rate being referred to based on the actually measured voltage change rate calculated as a present discharging rate.

9. The state-of-charge estimation apparatus for the lithium ion battery according to claim 7, wherein the estimation computing circuitry is configured to obtain the present state of charge from a pair of closest values for the state of charge between one or more values for the state of charge obtained during the charging and one or more values for the state of charge obtained during the discharging.

10. The state-of-charge estimation apparatus for the lithium ion battery according to claim 7, wherein, a current value as to bring the discharging to an end in one hour after the lithium ion battery having a capacity of a rated capacity value is charged to a state of charge of 100% and starts being subjected to constant current discharging is defined as "current value of 1 C" and the charging performed at a current of 1 C is defined as "charging at 1 C", the estimation computing circuitry is configured to:

store a range of the state of charge obtained at a time of charging at a rate of 2 C or higher in the second storage;

store values for the state of charge obtained at a time of discharging at the rate of 2 C or higher in the second storage; and obtain, as the present state of charge, a value for the state of charge included in the range of the state of charge at the time of charging among the values for the state of charge at the time of discharging at the rate of 2 C or higher.

11. The state-of-charge estimation apparatus for the lithium ion battery according to claim 7, wherein, a current value as to bring the discharging to an end in one hour after the lithium ion battery having a capacity of a rated capacity value is charged to a state of charge of 100% and starts being subjected to constant current discharging is defined as "current value of 1 C" and the charging performed at a current of 1 C is defined as "charging at 1 C", the estimation computing circuitry is configured to:

obtain the present state of charge from a result of a comparison between the voltage change rate during the charging and the voltage change rate during the discharging, which are calculated at a time of charging at a rate of 2 C or higher; and obtain the present state of charge from the voltage change rate corresponding to an inflection point when the inflection point of the voltage change rate has been successfully extracted from a plurality of voltage change rates during the charging calculated at a time of charging at a rate of 1 C or lower or a plurality of voltage change rates during the discharging calculated at a time of discharging at the rate of 1 C or lower.

12. The state-of-charge estimation apparatus for the lithium ion battery according to claim 7, wherein the estimation computing circuitry is configured to compare the present state of charge obtained from the voltage change rate and the present state of charge obtained through integrating the current during the charging and discharging, to thereby correct the present state of charge.

\* \* \* \* \*